US011114307B2

(12) United States Patent
Yamamoto

(10) Patent No.: US 11,114,307 B2
(45) Date of Patent: Sep. 7, 2021

(54) METHOD OF PRODUCING A WAFER FROM AN INGOT INCLUDING A PEEL-OFF DETECTING STEP

(71) Applicant: DISCO CORPORATION, Tokyo (JP)

(72) Inventor: Ryohei Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/365,014

(22) Filed: Mar. 26, 2019

(65) Prior Publication Data

US 2019/0304800 A1  Oct. 3, 2019

(30) Foreign Application Priority Data

Mar. 27, 2018  (JP) .............................. JP2018-059662

(51) Int. Cl.
| H01L 21/322 | (2006.01) |
| B23K 26/00 | (2014.01) |
| H01L 21/78 | (2006.01) |
| B28D 5/00 | (2006.01) |
| B23K 26/53 | (2014.01) |

(52) U.S. Cl.
CPC ...... *H01L 21/3221* (2013.01); *B23K 26/0006* (2013.01); *B23K 26/53* (2015.10); *B28D 5/0011* (2013.01); *H01L 21/78* (2013.01)

(58) Field of Classification Search
None
See application file for complete search history.

(56) References Cited

U.S. PATENT DOCUMENTS

| 2007/0275543 | A1* | 11/2007 | Abe ......................... H01L 21/78 |
| | | | 438/464 |
| 2016/0228984 | A1* | 8/2016 | Hirata ................... C30B 29/406 |
| 2018/0085851 | A1* | 3/2018 | Hirata ................ B23K 26/0626 |

FOREIGN PATENT DOCUMENTS

| JP | 2000094221 A | 4/2000 |
| JP | 2016111143 A | 6/2016 |

\* cited by examiner

*Primary Examiner* — Nilufa Rahim

(74) *Attorney, Agent, or Firm* — Greer Burns & Crain, Ltd.

(57) ABSTRACT

A method of producing a wafer includes a peel-off layer forming step to form a peel-off layer in a hexagonal single-crystal ingot by applying a laser beam having a wavelength transmittable through the hexagonal single-crystal ingot while positioning a focal point of the laser beam in the hexagonal single-crystal ingot at a depth corresponding to the thickness of a wafer to be produced from an end face of the hexagonal single-crystal ingot, an ultrasonic wave generating step to generate ultrasonic waves from an ultrasonic wave generating unit positioned in facing relation to the wafer to be produced across a water layer interposed therebetween, thereby to break the peel-off layer, and a peel-off detecting step to detect when the wafer to be produced is peeled off the hexagonal single-crystal ingot by positioning an image capturing unit sideways of the wafer to be produced.

13 Claims, 6 Drawing Sheets

METHOD OF PRODUCING A WAFER FROM AN INGOT INCLUDING A PEEL-OFF DETECTING STEP

BACKGROUND OF THE INVENTION

Field of the Invention

The present invention relates to a method of and an apparatus for producing a wafer from a hexagonal single-crystal ingot.

Description of the Related Art

Devices such as integrated circuits (ICs), large scale integrated circuits (LSIs), light emitting diodes (LEDs), etc. are formed on a wafer of Si (silicon), $Al_2O_3$ (sapphire), or the like by depositing a function layer on the face side of the wafer and demarcating the face side into a plurality of areas by a grid of projected dicing lines. Power devices, LEDs, or the like are formed on a wafer of single-crystal SiC (silicon carbide) by depositing a function layer on the face side of the wafer and demarcating the face side into a plurality of areas by a grid of projected dicing lines. A wafer with devices formed thereon is divided into individual device chips along projected dicing lines by a cutting apparatus, a laser processing apparatus, or the like. The produced device chips will be used in electric appliances such as mobile phones, personal computers, and so on.

A wafer on which devices are to be formed is generally produced by cutting a thin slice off a cylindrical semiconductor ingot with a wire saw. The wafer thus produced has its face and reverse sides polished to a mirror finish (see, for example, Japanese Patent Laid-open No. 2000-94221). Such a customary process of slicing wafers off a semiconductor ingot with a wire saw and polishing the face and reverse sides of the wafers is not economic because most (70% through 80%) of the semiconductor ingot is wasted. In particular, ingots of hexagonal single-crystal SiC are difficult to cut with a wire saw as they are hard, are poor in productivity as they take considerable time to cut, and pose problems in producing wafers efficiently as hexagonal single-crystal ingot are expensive to obtain.

The present applicant has proposed a technology in which a laser beam having a wavelength transmittable through hexagonal single-crystal SiC is applied to an ingot of hexagonal single-crystal SiC while positioning its focal point within the ingot, thereby forming a peel-off layer at a projected severance plane in the ingot, and a wafer is peeled off from the ingot from the peel-off layer that serves as a severance initiating point (see, for example, Japanese Patent Laid-open No. 2016-111143).

SUMMARY OF THE INVENTION

However, the proposed technology is problematic in that it is difficult and leads to poor production efficiency to peel wafers off a hexagonal single-crystal ingot, and that it is difficult to determine whether the peeling of a wafer off a hexagonal single-crystal ingot is completed or not.

It is therefore an object of the present invention to provide a method of producing a wafer and an apparatus for producing a wafer which make it easy to peel a wafer off a hexagonal single-crystal ingot from a peel-off layer therein that serves as a severance initiating point and which also make it easy to determine that the peeling of a wafer off a hexagonal single-crystal ingot is completed.

In accordance with an aspect of the present invention, there is provided a method of producing a wafer from a hexagonal single-crystal ingot, including: a peel-off layer forming step of forming a peel-off layer in the hexagonal single-crystal ingot by applying a laser beam having a wavelength transmittable through the hexagonal single-crystal ingot while positioning a focal point of the laser beam in the hexagonal single-crystal ingot at a depth corresponding to a thickness of a wafer to be produced from an end face of the hexagonal single-crystal ingot; an ultrasonic wave generating step of generating ultrasonic waves from an ultrasonic wave generating unit positioned in facing relation to the wafer to be produced across a water layer interposed therebetween, thereby to break the peel-off layer; and a peel-off detecting step of positioning an image capturing unit sideways of the wafer to be produced and detecting when the wafer to be produced is peeled off the hexagonal single-crystal ingot.

Preferably, the hexagonal single-crystal ingot includes a hexagonal single-crystal SiC ingot having a c-axis and a c-plane perpendicular to the c-axis, and the peel-off layer forming step of forming a peel-off layer includes the peel-off layer that is made up of modified regions where SiC is separated into Si and C in the ingot and a succession of cracks extending isotropically along the c-plane from the modified regions, by applying a laser beam having a wavelength transmittable through hexagonal single-crystal SiC to the hexagonal single-crystal SiC ingot while a focal point of the laser beam is being positioned in the hexagonal single-crystal SiC ingot at a depth corresponding to the thickness of the wafer from an end face of the hexagonal single-crystal SiC ingot. Preferably, the hexagonal single-crystal ingot includes a hexagonal single-crystal SiC ingot having a c-axis inclined to a line normal to an end face thereof and a c-plane, the c-plane and the end face forming an off-angle therebetween, and the peel-off layer forming step of forming a peel-off layer includes the peel-off layer that is formed by continuously forming a modified region in the hexagonal single-crystal SiC ingot in a direction perpendicular to a direction in which the off-angle is formed, producing a succession of cracks extending isotropically along the c-plane from the modified region, indexing-feeding the hexagonal single-crystal SiC ingot and the focal point relatively to each other by a distance that is not larger than the width of the cracks in the direction in which the off-angle is formed, then continuously forming a modified region in the hexagonal single-crystal SiC ingot in the direction perpendicular to the direction in which the off-angle is formed, and producing a succession of cracks extending isotropically along the c-plane from the last-mentioned modified region.

In accordance with another aspect of the present invention, there is provided an apparatus for producing a wafer from a hexagonal single-crystal ingot having a peel-off layer formed therein by applying a laser beam having a wavelength transmittable through the hexagonal single-crystal ingot while positioning a focal point of the laser beam in the hexagonal single-crystal ingot at a depth corresponding to a thickness of a wafer to be produced from an end face of the hexagonal single-crystal ingot, an ultrasonic wave generating unit generating ultrasonic waves, the ultrasonic wave generating unit having an end face positioned in facing relation to the wafer to be produced across a water layer interposed therebetween, an image capturing unit positioned sideways of the wafer to be produced, and a peel-off detecting means coupled to the image capturing unit, for detecting when the wafer to be produced is peeled off the hexagonal single-crystal ingot based on a change in the gap between the wafer to be produced and the hexagonal single-crystal ingot.

With the method of producing a wafer according to the present invention, a wafer can easily be peeled off a hexagonal single-crystal ingot from a peel-off layer that serves as a severance initiating point, and the completion of the peeling of the wafer from the hexagonal single-crystal ingot can easily be determined based on a change in the height of an upper surface of the wafer to be produced.

With the apparatus for producing a wafer according to the present invention, a wafer can easily be peeled off a hexagonal single-crystal ingot from a peel-off layer that serves as a severance initiating point, and the completion of the peeling of the wafer from the hexagonal single-crystal ingot can easily be determined based on a change in the height of an upper surface of the wafer to be produced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
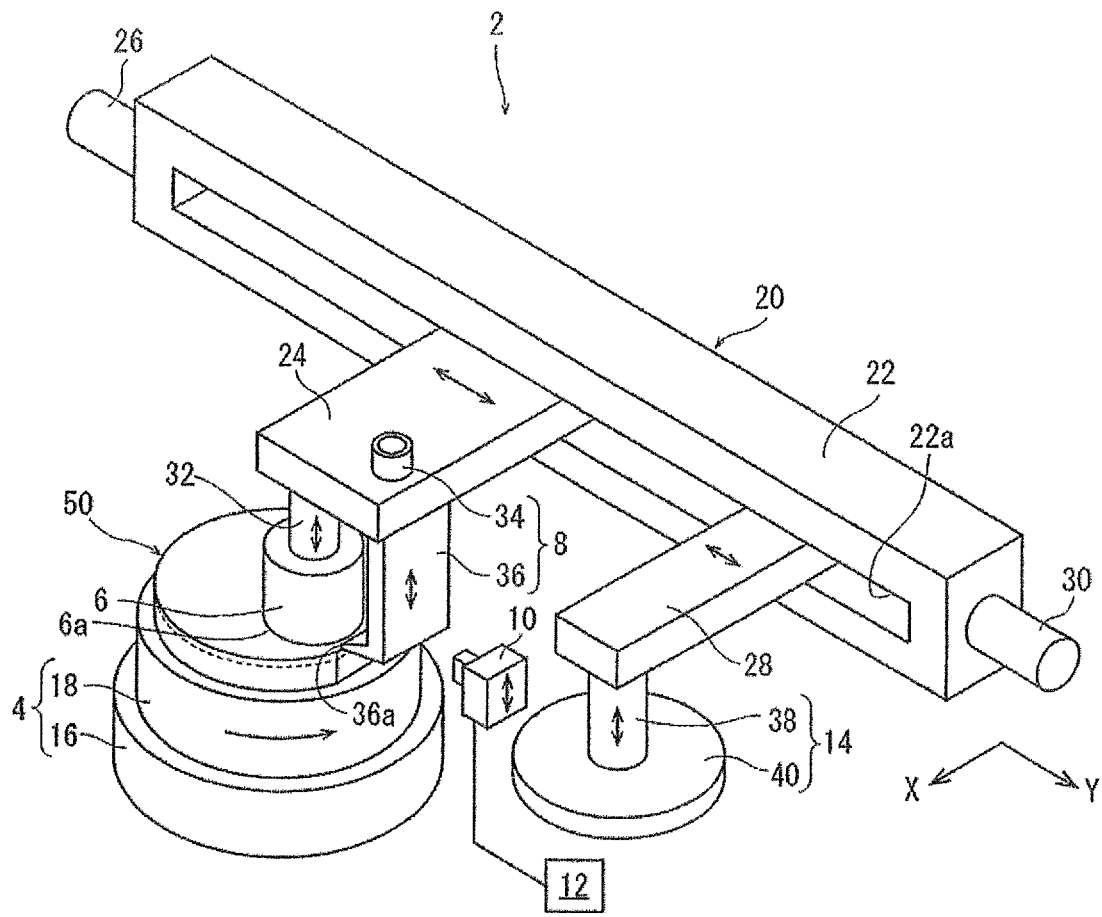
FIG. 1 is a perspective view of an apparatus for producing a wafer, i.e., a wafer producing apparatus, according to an embodiment of the present invention.

A method of and an apparatus for producing a wafer according to an embodiment of the present invention will be described in detail below with reference to the drawings. As illustrated in FIG. 1, an apparatus 2 for producing a wafer, i.e., a wafer producing apparatus 2, according to the present embodiment, includes an ingot holding unit 4 for holding a hexagonal single-crystal ingot (hereinafter simply referred to as "ingot") thereon, an ultrasonic wave generating unit 6 having a lower end face 6a that faces a wafer to be produced from the ingot, for applying ultrasonic waves to the ingot through a water layer interposed therebetween, water supply means 8 for supplying water between the wafer to be produced from the ingot and the ultrasonic wave generating unit 6 to form the water layer, an image capturing unit 10 positioned sideways of the wafer to be produced, a peel-off detecting means 12 electrically connected to the image capturing unit 10, for detecting the peel-off of the wafer to be produced from the ingot based on a change in the gap between the wafer to be produced and the ingot, and wafer holding means 14 holding a wafer peeled off the ingot.

Figure 2:
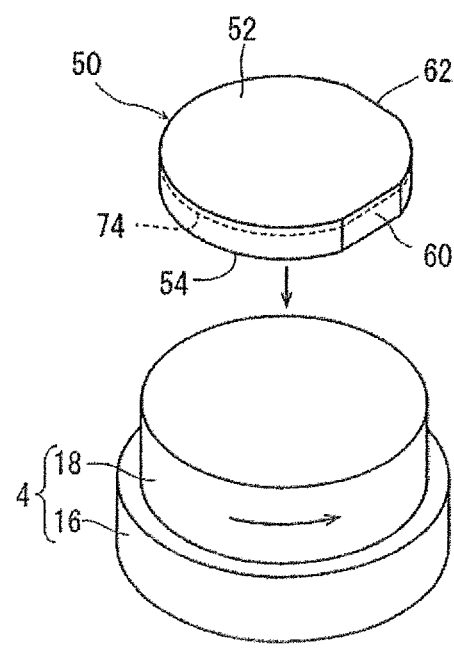
FIG. 2 is a perspective view of parts of the wafer producing apparatus depicted in FIG. 1, illustrating the manner in which an SiC ingot is being placed onto an ingot holding unit of the wafer producing apparatus.

The ingot holding unit 4 will be described in detail below with reference to FIGS. 1 and 2. The ingot holding unit 4 according to the present embodiment includes a cylindrical base 16, a cylindrical holding table 18 rotatably mounted on an upper surface of the base 16, and an electric motor, not depicted, for rotating the holding table 18 about an axis that extends vertically through the diametric center of the holding table 18. The ingot holding unit 4 holds the ingot thereon that is secured to an upper surface of the holding table 18 by an adhesive such as an epoxy resin adhesive, for example. Alternatively, a porous suction chuck, not depicted, connected to suction means, not depicted, may be placed on the upper surface of the holding table 18, and the ingot holding unit 4 may hold the ingot on the porous suction chuck under suction forces generated by the suction means and acting on an upper surface of the porous suction chuck.

The wafer producing apparatus 2 further includes a Y-axis moving mechanism 20 for moving the ultrasonic wave generating unit 6, the water supply means 8, and the wafer holding means 14 in a Y-axis direction indicated by the arrow Y in FIG. 1. The Y-axis moving mechanism 20 has a frame 22 in the shape of a rectangular parallelepiped having an elongate rectangular guide opening 22a defined therein that extends in the Y-axis direction, a first ball screw, not depicted, extending in the Y-axis direction in the frame 22, a first movable arm 24 having a proximal end joined to the first ball screw and extending therefrom in an X-axis direction indicated by the arrow X in FIG. 1, a first electric motor 26 connected to an end of the first ball screw, a second ball screw, not depicted, extending in the Y-axis direction in the frame 22, a second movable arm 28 having a proximal end joined to the second ball screw and extending therefrom in the X-axis direction, and a second electric motor 30 connected to an end of the second ball screw. When the Y-axis moving mechanism 20 is in operation, the first ball screw converts rotary motion of the first motor 26 into linear motion and transmits the linear motion to the first movable arm 24, moving the first movable arm 24 in the Y-axis direction along the guide opening 22a. The second ball screw converts rotary motion of the second motor 30 into linear motion and transmits the linear motion to the second movable arm 28, moving the second movable arm 28 in the Y-axis direction along the guide opening 22a. The X-axis direction and the Y-axis direction extend perpendicularly to each other, and jointly define a substantially horizontal XY plane.

As illustrated in FIG. 1, first lifting and lowering means 32 that is of a cylindrical shape is connected to the lower surface of a distal end of the first movable arm 24. The ultrasonic wave generating unit 6 that is also of a cylindrical shape is connected to the lower end of the first lifting and lowering means 32. Therefore, when the first movable arm 24 is moved in the Y-axis direction, the first lifting and lower means 32 and the ultrasonic wave generating unit 6 are also moved in the Y-axis direction. The first lifting and lowering means 32 may comprise an electric cylinder assembly including a ball screw and an electric motor. The first lifting and lowering means 32 vertically moves the ultrasonic wave generating unit 6 and stops the ultrasonic wave generating unit 6 in a desired vertical position, holding a circular lower end face 6a thereof in vertically facing relation to a wafer to be produced from the ingot held on the holding table 18. The ultrasonic wave generating unit 6 is made of piezoelectric ceramics or the like for generating ultrasonic waves.

As illustrated in FIG. 1, the water supply means 8 includes a tubular joint port 34 mounted on the upper surface of the distal end of the first movable arm 24, a nozzle 36 vertically movably supported on the lower surface of the distal end of the first movable arm 24, and a nozzle lifting and lowering mechanism, not depicted, for lifting and lowering the nozzle 36. When the first movable arm 24 is moved in the Y-axis direction, the water supply means 8 is also moved in the Y-axis direction. The joint port 34 is connected to a water supply, not depicted, through a water supply hose, not depicted. The nozzle 36 is spaced from the ultrasonic wave generating unit 6 in the Y-axis direction and extends downwardly from the lower surface of the distal end of the first movable arm 24. The nozzle 36 has a lower end portion inclined slightly downwardly and extends in the Y-axis direction toward the ultrasonic wave generating unit 6. The nozzle 36 is of a hollow structure and has an upper end held in fluid communication with the joint port 34 and a lower end that is open as a nozzle outlet 36a at the distal end of the inclined lower end portion thereof. The nozzle lifting and lowering mechanism, which may comprise an electric cylinder assembly, for example, lifts and lowers the nozzle 36 and stops the nozzle 36 in a desired vertical position, positioning the nozzle outlet 36a between a wafer to be produced from the ingot on the holding table 18 and the end face 6a of the ultrasonic wave generating unit 6. The water supply means 8 thus constructed supplies water introduced from the water supply into the joint port 34 through the nozzle outlet 36a into a space between a wafer to be produced from the ingot on the holding table 18 and the end face 6a of the ultrasonic wave generating unit 6, thereby forming a water layer therebetween.

According to the present embodiment, as illustrated in FIG. 1, the image capturing unit 10 is disposed behind the nozzle 36 so that it will not be sprinkled with water supplied from the nozzle outlet 36a of the nozzle 36. The image capturing unit 10 is vertically movably supported by a support bracket, not depicted. The image capturing unit 10 is lifted and lowered by a lifting and lowering mechanism, not depicted, which includes an electric cylinder assembly, and is stopped in a desired vertical position. The image capturing unit 10 is positioned sideways of the wafer to be produced, and captures an image of a peel-off layer formed in the ingot and a gap between the wafer to be produced and the ingot. The image capturing unit 10 may not be disposed behind the nozzle 36 insofar as it is disposed in a position where its image capturing process is not obstructed by the water from the nozzle outlet 36a of the nozzle 36. The peel-off detecting means 12 that is electrically connected to the image capturing unit 10 is supplied with an electric signal output from the image capturing unit 10. The peel-off detecting means 12 includes a computer that includes a central processing unit (CPU) that performs processing operations according to a control program, a read-only memory (ROM) that stores the control program, etc., and a read/write random-access memory (RAM) that stores the results of the processing operations. The peel-off detecting means 12 detects when the wafer to be produced from the ingot is peeled off the ingot based on a change in the gap between the wafer to be produced from the ingot and the ingot. Specifically, the peel-off detecting means 12 binarizes the image captured of the ingot 50 by the image capturing unit 10, and detects the peel-off of the wafer from the ingot 50 based on the binarized image at the time the gap between the wafer to be produced and the ingot becomes equal to or larger than a predetermined value.

As illustrated in FIG. 1, wafer holding means 14 is connected to the lower surface of a distal end of the second movable arm 28. Therefore, when the second movable arm 28 is moved in the Y-axis direction, the wafer holding means 14 is also moved in the Y-axis direction. The wafer holding means 14 includes second lifting and lowering means 38 that is of a cylindrical shape extending downwardly from the lower surface of a distal end of the second movable arm 28 and a disk-shaped holder 40 connected to the lower end of the second lifting and lowering means 38, for holding the wafer peeled off the ingot under suction. The second lifting and lowering means 38, which may comprise an electric cylinder assembly, for example, lifts and lowers the holder 40 and stops the holder 40 in a desired vertical position, keeping a lower surface thereof in contact with the wafer to be produced from the ingot. A porous suction chuck, not depicted, that is connected to suction means, not depicted, is attached to a lower end face of the holder 40. While the lower end face of the holder 40 is in contact with the upper surface of the wafer peeled off the ingot, the wafer holding means 14 holds the wafer on the porous suction chuck under suction forces generated by the suction means and acting on the lower surface of the suction chuck.

Figure 3A:
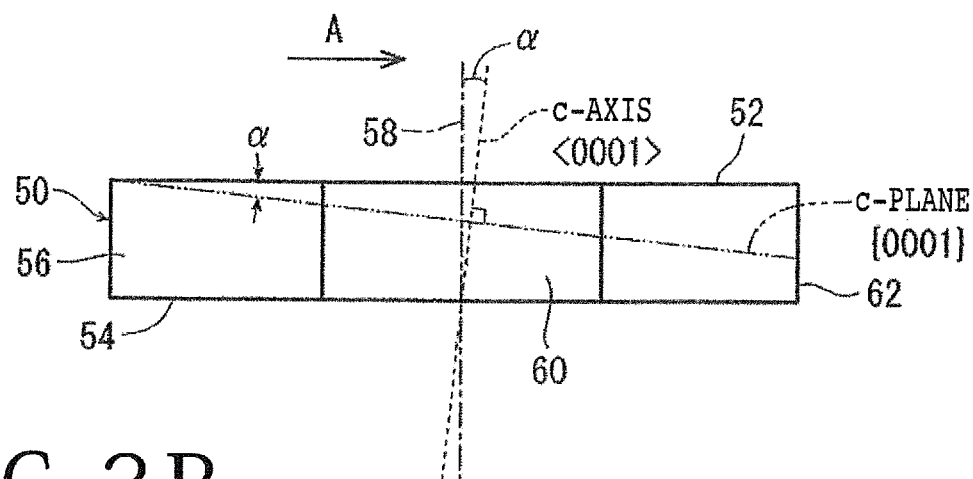
FIG. 3A is a front elevational view of the SiC ingot.
Figure 3B:
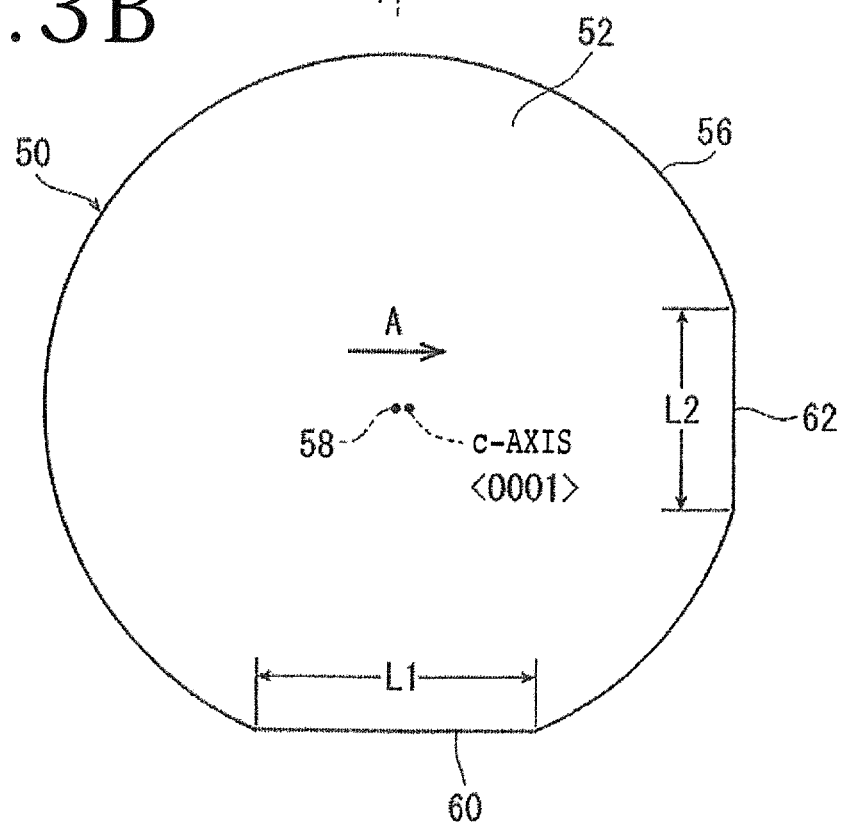
FIG. 3B is a plan view of the SiC ingot.

FIGS. 3A and 3B illustrate an ingot 50 before a peel-off layer is formed therein. The ingot 50 is made of hexagonal single-crystal SiC and has a cylindrical shape as a whole. The ingot 50 has a circular first end face 52, a circular second end face 54 opposite the first end face 52, a peripheral face 56 positioned between the first end face 52 and the second end face 54, a c-axis (<0001> direction) extending from the first end face 52 to the second end face 54, and a c-plane ({0001} plane) perpendicular to the c-axis. The c-axis is inclined to a line 58 normal to the first end face 52, and the c-plane and the first end face 52 form an off-angle α (e.g., α=1, 3, or 6 degrees) therebetween. The direction in which the off-angle α is formed is indicated by the arrow A in FIGS. 3A and 3B. The peripheral face 56 of the ingot 50 has a first orientation flat 60 and a second orientation flat 62, each of a rectangular shape, for indicating a crystal orientation. The first orientation flat 60 lies parallel to the direction A in which the off-angle α is formed, whereas the second orientation flat 62 lies perpendicularly to the direction A in which the off-angle α is formed. As depicted in FIGS. 3A and 3B, the length L2 of the second orientation flat 62 is smaller than the length L1 of the first orientation flat 60, as viewed from above (L2<L1). The ingot from which a wafer is peeled off by the wafer producing apparatus 2 after a peel-off layer has been formed therein is not limited to the above ingot 50, but may be a hexagonal single-crystal SiC ingot where the c-axis is not inclined to the line normal to the first end face and the off-angle between the c-plane and the first end face is 0 degree, i.e., the line normal to the first end face and the c-axis are aligned with each other, or a hexagonal single-crystal ingot made of a material other than hexagonal single-crystal SiC, such as GaN (gallium nitride) or the like.

A method of producing a wafer, i.e., a wafer producing method, according to the present embodiment will be described in detail below. According to the present embodiment, a peel-off layer forming step is initially carried out to form a peel-off layer in the ingot 50 by applying a laser beam having a wavelength transmittable through the ingot 50 to the ingot 50 while positioning its focal point in the ingot 50 at a depth corresponding to the thickness of a wafer to be produced from an end face of the ingot 50. The peel-off layer forming step can be performed using a laser processing apparatus 64, which is partly illustrated in FIGS. 4A and 4B. The laser processing apparatus 64 includes a chuck table 66 for holding a workpiece, i.e., the ingot 50, thereon and a beam condenser 68 for applying a pulsed laser beam LB to the workpiece on the chuck table 66. The chuck table 66, which is constructed to hold the workpiece under suction on its upper surface, is rotatable about a vertical axis by rotating means, not depicted, and is also linearly movable in an x-axis direction by x-axis moving means, not depicted, and a y-axis direction by y-axis moving means, not depicted. The beam condenser 68 includes a condensing lens, not depicted, for focusing and applying the pulsed laser beam LB that is oscillated by a pulsed laser beam oscillator, not depicted, of the laser processing apparatus 64, to the workpiece. The x-axis direction is indicated by the arrow x in FIGS. 4A and 4B, and the y-axis direction is indicated by the arrow y in FIG. 4A. The x-axis direction is perpendicular to the y-axis direction, and the x-axis direction and the y-axis direction jointly define a substantially horizontal xy plane. The X- and Y-axis directions that are indicated by the arrows X, Y (capital letters) in FIG. 1 and the x- and y-axis directions that are indicated by the arrows x, y (lower-case letters) in FIG. 4A may agree with or may be different from each other.

Figure 4A:
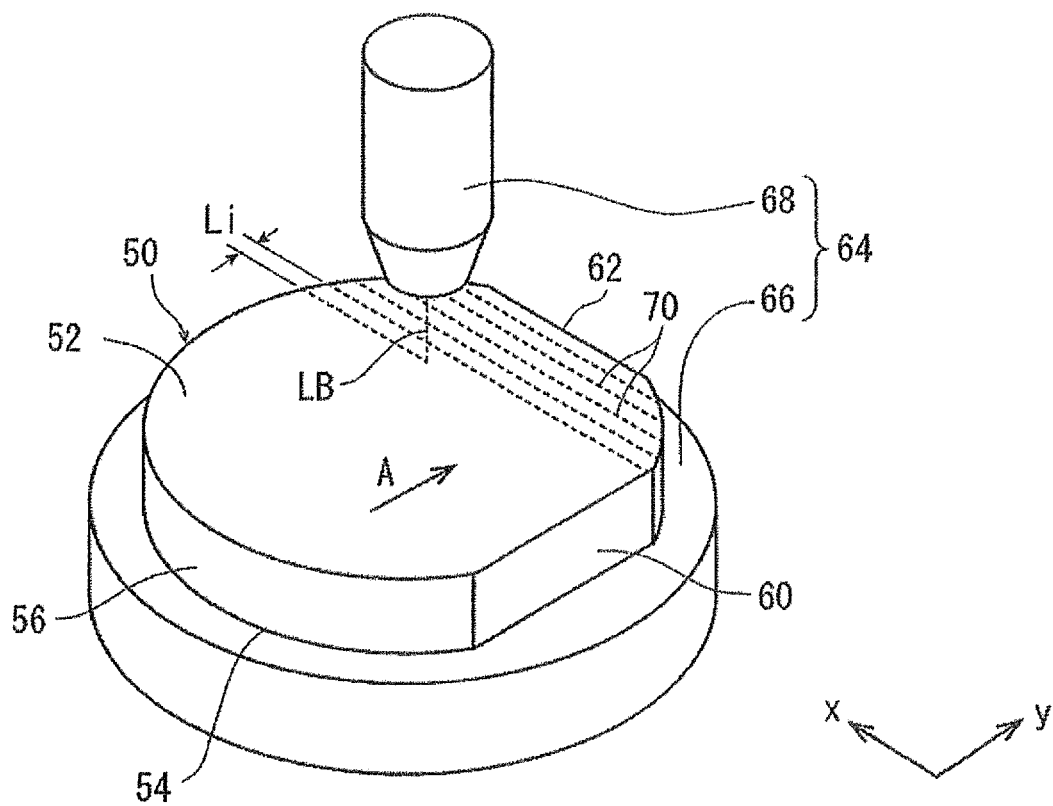
FIG. 4A is a perspective view illustrating the manner in which a peel-off layer is being formed in the SiC ingot depicted in FIG. 3A.

The peel-off layer forming step will be described in detail below with reference to FIGS. 4A and 4B. In the peel-off layer forming step, the ingot 50 is held under suction on an upper surface of the chuck table 66 while an upper end face, referred to as a first end face 52 in the present embodiment, of the ingot 50 is facing upwardly. The ingot 50 may alternatively be secured to the chuck table 66 by an adhesive, e.g., an epoxy resin adhesive, interposed between a lower end face, referred to as a second end face 54 in the present embodiment, of the ingot 50 and the upper surface of the chuck table 66. Then, an image capturing unit, not depicted, of the laser processing apparatus 64 captures an image of the ingot 50 from above the ingot 50. Based on the image of the ingot 50 that is captured by the image capturing unit, the x-axis moving means, the y-axis moving means, and the rotating means of the laser processing apparatus 64 are controlled to move and rotate the chuck table 66 to adjust the direction of the ingot 50 to a predetermined direction and to adjust the relative position of the ingot 50 with respect to the beam condenser 68 to a predetermined position in the xy plane. For adjusting the direction of the ingot 50 to a predetermined direction, as illustrated in FIG. 4A, the rotating means is controlled to bring the second orientation flat 62 into alignment with the x-axis direction, thereby aligning a direction perpendicular to the direction A in which the off-angle α is formed with the x-axis direction and also aligning the direction A in which the off-angle α is formed with the y-axis direction.

Figure 4B:
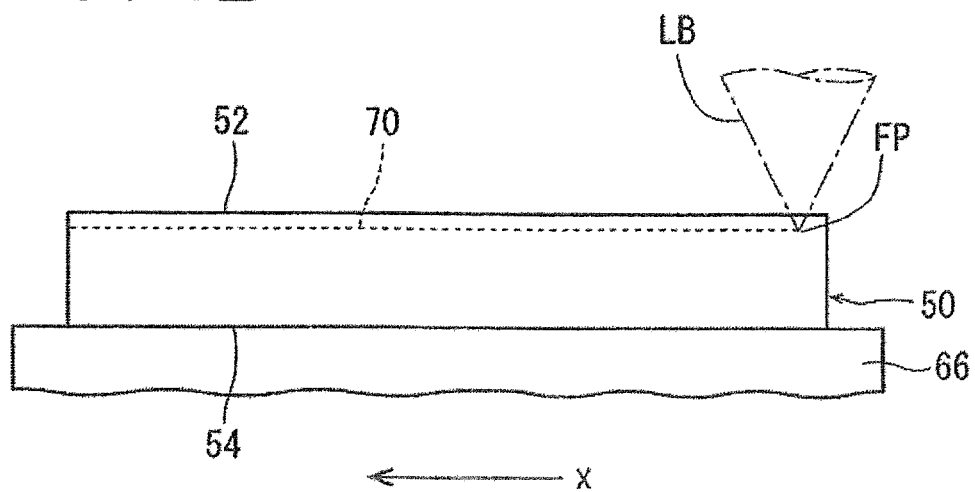
FIG. 4B is a front elevational view illustrating the manner in which a peel-off layer is being formed in the SiC ingot depicted in FIG. 3A.
Figure 5A:
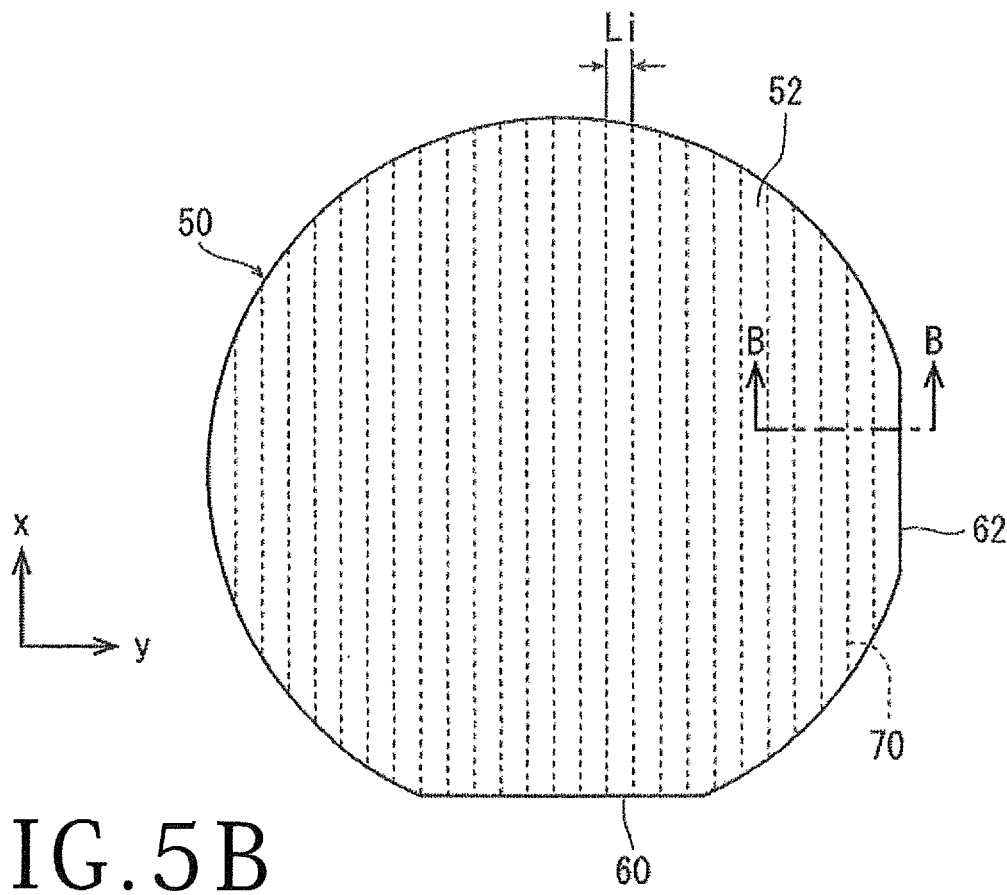
FIG. 5A is a plan view of the SiC ingot with a peel-off layer formed therein.
Figure 5B:
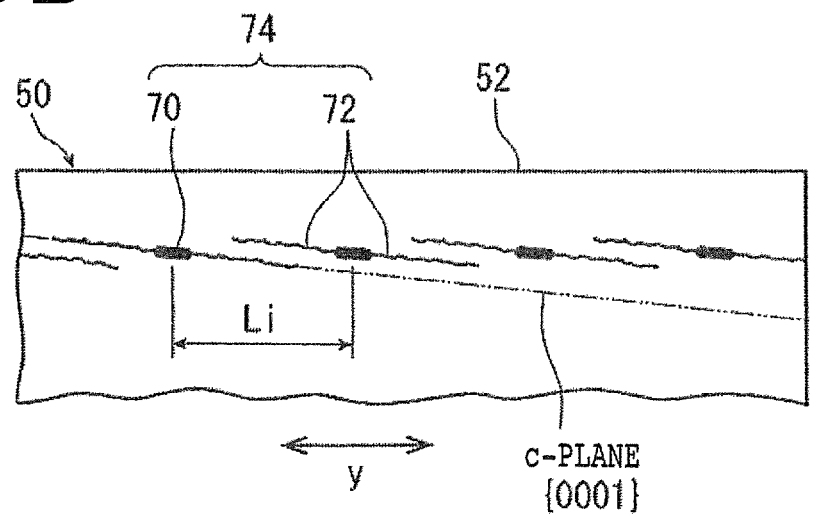
FIG. 5B is a cross-sectional view taken along line B-B of FIG. 5A.

Then, focal point position adjusting means, not depicted, of the laser processing apparatus 64 is controlled to lift or lower the beam condenser 68 to position a focal point FP of the pulsed laser beam LB in the ingot 50 at a depth of 300 μm, for example, corresponding to the thickness of a wafer to be produced from the first end face 52 of the ingot 50, as illustrated in FIG. 4B. Then, a peel-off layer forming process is carried out. In the peel-off layer forming process, while linearly moving the chuck table 66 at a predetermined feed rate along the x-axis direction aligned with the direction perpendicular to the direction A in which the off-angle α is formed, the beam condenser 68 applies the pulsed laser beam LB whose wavelength is transmittable through the ingot 50, i.e., single-crystal SiC, to the ingot 50. During the peel-off layer forming process, as illustrated in FIGS. 5A and 5B, the pulsed laser beam LB applied to the ingot 50 separates SiC in the ingot 50 into Si (silicon) and C (carbon) and the pulsed laser beam LB subsequently applied to the ingot 50 is absorbed by previously formed C, producing a modified region 70 where SiC is successively separated into Si and C. The modified region 70 is continuously formed in the ingot 50 along the direction perpendicular to the direction A in which the off-angle α is formed. At the same time, a succession of cracks 72 extending isotropically along the c-plane from the modified region 70 are developed in the ingot 50. In the peel-off layer forming process, the beam condenser 68 rather than the chuck table 66 may be linearly moved at a predetermined feed rate along the x-axis direction.

Figure 6:
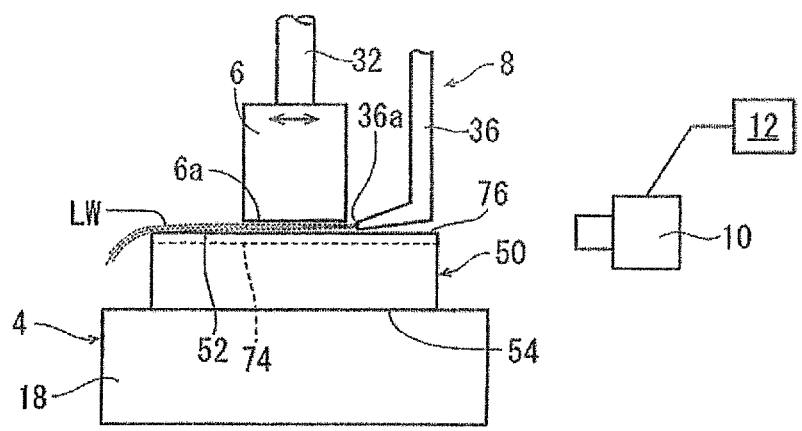
FIG. 6 is a front elevational view of parts of the wafer producing apparatus, illustrating the manner in which ultrasonic waves are being applied to the SiC ingot.

As illustrated in FIGS. 4A, 4B, 5A, and 5B, after the peel-off layer forming process, the laser processing apparatus 64 performs an indexing feed process. In the indexing feed process, the y-axis moving means index-feeds the chuck table 66 relatively to the focal point FP along the y-axis direction aligned with the direction A in which the off-angle α is formed by a predetermined indexing feed distance Li, e.g., in the range from 250 to 400 μm, that is not larger than the width of the cracks 72. In the indexing feed process, the beam condenser 68 rather than the chuck table 66 may be linearly moved along the y-axis direction. Then, the peel-off layer forming process and the indexing feed process are alternately carried out to form a plurality of modified regions 70, each extending continuously along the direction perpendicular to the direction A in which the off-angle α is formed, at spaced intervals each equal to the indexing feed distance Li in the direction A in which the off-angle α is formed, and also to form a succession of cracks 72 extending isotropically along the c-plane from the modified regions 70, such that adjacent cracks 72 in the direction A in which the off-angle α is formed vertically overlap each other. In this manner, a peel-off layer 74 made up of the modified regions 70 and the cracks 72 is formed in the ingot 50 at the depth, which corresponds to the thickness of a wafer to be peeled off, from the first end face 52 of the ingot 50. The peel-off layer 74 has a lower mechanical strength than the remainder of the ingot 50, so that a wafer can be peeled off from the ingot 50 along the peel-off layer 74, as described later. The peel-off layer 74 can be formed in the peel-off layer forming step under the following processing conditions:

Wavelength of the pulsed laser beam: 1064 nm
Repetitive frequency: 60 kHz
Average output power: 1.5 W
Pulse duration: 4 ns
Focal point diameter: 3 μm
Numerical aperture (NA) of the condensing lens: 0.65
Feed speed: 200 mm/s The peel-off layer forming step is followed by an ultrasonic wave generating step in which the ultrasonic wave generating unit 6 is positioned in facing relation to a wafer to be produced from the ingot 50 across a water layer interposed therebetween and actuated to generate ultrasonic waves that act through the water layer on the ingot 50 to break the peel-off layer 74. According to the present embodiment, in the ultrasonic wave generating step, as illustrated in FIG. 2, the ingot holding unit 4 holds the ingot 50 thereon while the first end face 52 that is closer to the peel-off layer 74 is facing upwardly. At this time, the ingot 50 may be secured to the holding table 18 by an adhesive such as an epoxy resin adhesive, for example, interposed between the second end face 54 of the ingot 50 and the upper surface of the holding table 18, or by suction forces acting on the upper surface of the holding table 18. Then, the first motor 26 of the Y-axis moving mechanism 20 is energized to move the first movable arm 24 to position the lower end face 6a of the ultrasonic wave generating unit 6 in vertically facing relation to a wafer to be produced from the ingot 50, i.e., a portion of the ingot 50 from the first end face 52 to the peel-off layer 74 according to the present embodiment, as illustrated in FIG. 1. Then, the first lifting and lowering means 32 lowers the ultrasonic wave generating unit 6 until the distance between the first end face 52 and the lower end face 6a of the ultrasonic wave generating unit 6 reaches a predetermined dimension, e.g., a value in the range from approximately 2 to 3 mm. When the distance reaches the predetermined value, the first lifting and lowering means 32 is inactivated. The nozzle lifting and lowering mechanism moves the nozzle 36 to position the nozzle outlet 36a of the nozzle 36 between the first end face 52 and the lower end face 6a of the ultrasonic wave generating unit 6. Then, the holding table 18 is rotated by the electric motor. While the first motor 26 is moving the first movable arm 24 along the Y-axis direction, water is supplied from the nozzle outlet 36a of the nozzle 36 to a space between the first end face 52 and the lower end face 6a of the ultrasonic wave generating unit 6, forming a water layer LW in the space, as illustrated in FIG. 6. The ultrasonic wave generating unit 6 is then energized to generate ultrasonic waves. At this time, the holding table 18 is rotated and the first movable arm 24 is linearly moved along the Y-axis direction in order to pass the ultrasonic wave generating unit 6 all over the first end face 52 of the ingot 50. Therefore, the ultrasonic waves generated by the ultrasonic wave generating unit 6 are applied through the water layer LW to the ingot 50 and hence to the peel-off layer 74 in its entirety. The ultrasonic waves applied to the peel-off layer 74 break the peel-off layer 74, peeling off the portion of the ingot 50 from the first end face 52 to the peel-off layer 74 as a wafer 76 from the broken peel-off layer 74 that serves as a severance initiating point.

In the ultrasonic wave generating step, the ultrasonic waves generated by the ultrasonic wave generating unit 6 should preferably have a frequency close to the natural frequency of the ingot 50. By thus setting the frequency of the ultrasonic waves, the ultrasonic waves applied to the ingot 50 are able to peel off the wafer 76 from the ingot 50 efficiently in a comparatively short period of time ranging from approximately one to three minutes even if the ultrasonic waves have a comparatively low output power level of approximately 200 W, for example. The frequency close to the natural frequency of the ingot 50 is in a range from 0.8 to 1.2 times the natural frequency of the ingot 50. For example, if the natural frequency of the ingot 50 is 25 kHz, then the frequency close to the natural frequency of the ingot 50 ranges from approximately 20 to 30 kHz. Even if the ultrasonic waves have a frequency in excess of the frequency close to the natural frequency of the ingot 50, e.g., a frequency beyond 30 kHz, the ultrasonic waves applied to the ingot 50 are able to peel off the wafer 76 from the ingot 50 efficiently in a comparatively short period of time providing the ultrasonic waves have a comparatively high output power level ranging from approximately 400 to 500 W, for example.

In the ultrasonic wave generating step, the temperature of the water supplied to the space between the first end face 52 of the ingot 50 and the lower end face 6a of the ultrasonic wave generating unit 6 should preferably be set to a temperature at which the water layer LW is prevented from producing cavitation when the ultrasonic wave generating unit 6 generates ultrasonic waves. Specifically, the temperature of the water should preferably be set to a value ranging from 0° C. to 25° C. According to such a water temperature setting, the energy of the generated ultrasonic waves is not converted into cavitation, but is effectively transmitted to the peel-off layer 74, efficiently breaking the peel-off layer 74.

Figure 7A:
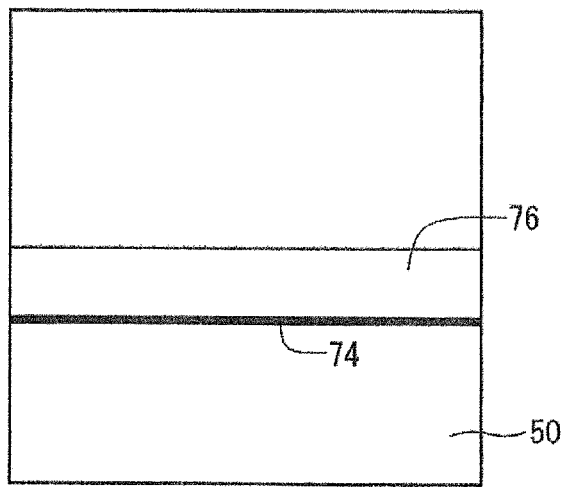
FIG. 7A is a schematic view of a binarized image of the SiC ingot before ultrasonic waves are applied thereto.

While the ultrasonic wave generating step is being carried out as described above, a peel-off detecting step is carried out in which the image capturing unit 10 is positioned sideways of the wafer 76 to be produced, and the peeling of the wafer 76 from the ingot 50 is detected. If the peel-off detecting unit 12 detects the peeling of the wafer 76 from the ingot 50, i.e., the peeling of the wafer 76 is completed, in the peel-off detecting step, then the ultrasonic wave generating step is finished. In the peel-off detecting step according to the present embodiment, the image capturing unit 10 is first positioned sideways of the wafer 76 to be produced, and then captures an image of an upper end portion of the ingot 50. Then, the peel-off detecting means 12 binarizes the image captured by the image capturing unit 10, and detects a gap between the wafer 76 to be produced and the ingot 50 based on the binarized image. FIG. 7A schematically illustrates an image captured by the image capturing unit 10 and binarized by the peel-off detecting means 12 before ultrasonic waves are applied to the ingot 50. In the image illustrated in FIG. 7A, the thickness (e.g., approximately 100 μm) of the peel-off layer 74 is detected as a gap between the wafer 76 to be produced and the ingot 50.

Figure 7B:
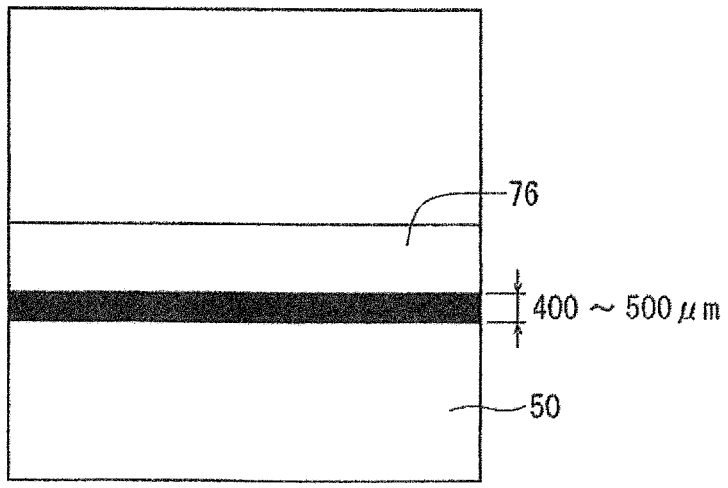
FIG. 7B is a schematic view of a binarized image at the time the gap between a wafer to be produced and the SiC ingot exceeds a predetermined value.

When ultrasonic waves are applied to the ingot 50, the peel-off layer 74 is broken, and the gap between the wafer 76 to be produced and the ingot 50 is widened. When the gap between the wafer 76 to be produced and the ingot 50 is equal to or smaller than a predetermined value (e.g., ranging from approximately 400 to 500 μm) that serves as a criterion as to whether the wafer 76 is peeled off the ingot 50 or not, the peel-off detecting means 12 determines that the wafer 76 is not fully peeled off the ingot 50, i.e., the wafer 76 to be produced is not wholly or partly peeled off the ingot 50, and the ultrasonic wave generating step continues. When the gap between the wafer 76 to be produced and the ingot 50 becomes equal to or larger than the predetermined value, as illustrated in FIG. 7B, the peel-off detecting means 12 determines that the wafer 76 is peeled off the ingot 50. According to the present embodiment, since the holding table 18 is rotating in the ultrasonic wave generating step, the peel-off detecting means 12 detects the gap between the wafer 76 to be produced and the ingot 50 along the entire circumference of the ingot 50. The peel-off detecting means 12 determines that the wafer 76 is peeled in its entirety off the ingot 50 when the gap detected along the entire circumference of the ingot 50 is equal to or larger than the predetermined value. When the peel-off of the wafer 76 to be produced is detected, the ultrasonic wave generating step and the peel-off detecting step are finished.

Figure 8:
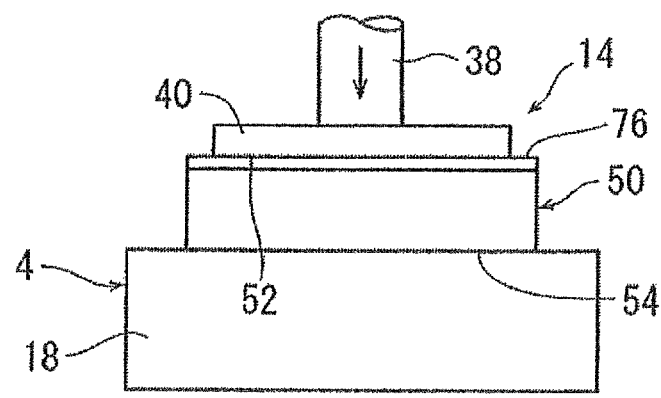
FIG. 8 is a front elevational view of parts of the wafer producing apparatus, illustrating the manner in which a wafer holding means is being held in intimate contact with a peeled-off wafer.
Figure 9:
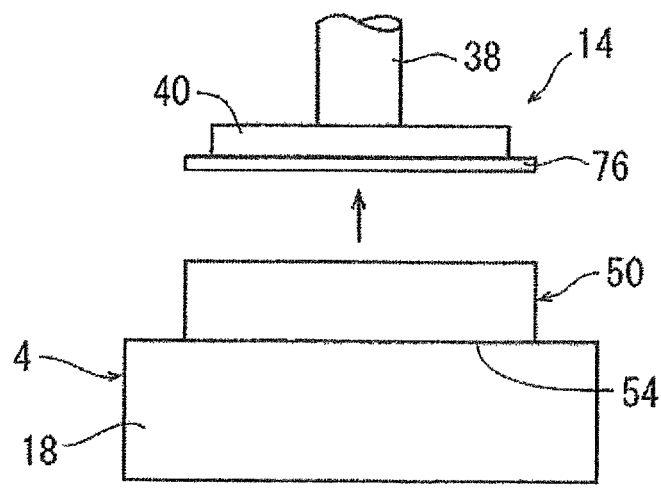
FIG. 9 is a front elevational view of the parts of the wafer producing apparatus, illustrating the manner in which the peeled-off wafer is being held under suction by the wafer holding means.

After the ultrasonic wave generating step and the peel-off detecting step have been carried out, the first electric motor 26 moves the first movable arm 24 to move the ultrasonic wave generating unit 6 and the nozzle 36 away from above the ingot 50, and the second electric motor 30 moves the second movable arm 28 to position the wafer holding means 14 directly above the ingot 50. Then, as illustrated in FIG. 8, the second lifting and lowering means 38 lowers the holder 40 to bring the lower end face of the holder 40 into contact with the first end face 52 of the ingot 50. Then, the suction means connected to the suction shuck on the holder 40 is actuated to apply suction forces to the suction chuck on the holder 40, which holds the peeled-off wafer 76 under suction thereon. Then, as illustrated in FIG. 9, the second lifting and lowering means 38 lifts the holder 40, and the second electric motor 30 moves the second movable arm 28 to transport the peeled-off wafer 76 from the ingot 50.

According to the present embodiment, as described above, the wafer 76 can easily be peeled off the ingot 50 from the peel-off layer 74 that serves as a severance initiating point, and the completion of the peeling of the wafer 76 from the ingot 50 can easily be determined. According to the present embodiment, since the ultrasonic wave generating step is finished upon completion of the peeling of the wafer 76 from the ingot 50, the period of time during which the ultrasonic wave generating step is carried out is not unduly increased, resulting in an increase in productivity of the wafer producing apparatus 2. According to the present embodiment, furthermore, the water layer LW is formed between the wafer 76 to be produced and the end face 6a of the ultrasonic wave generating unit 6 by supplying water to the space therebetween, and the ultrasonic waves are applied from the ultrasonic wave generating unit 6 to the ingot 50 through the water layer LW. Consequently, the wafer 76 can be peeled off the ingot 50 without using a water tank in which wafer peeling would take place. The wafer producing apparatus 2 is economical as no time and no water is wasted to fill such a water tank.

In the peel-off layer forming step according to the present embodiment, the modified region 70 is continuously formed in the ingot 50 along the direction perpendicular to the direction A in which the off-angle α is formed, and the ingot 50 is indexing-fed along the direction A in which the off-angle α is formed. However, the direction along which the modified region 70 is formed may not be the direction perpendicular to the direction A in which the off-angle α is formed, and the direction in which the ingot 50 is indexing-fed may not be the direction A in which the off-angle α is formed. According to the present embodiment, the first lifting and lower means 32 for lifting and lowering the ultrasonic wave generating unit 6 and the nozzle lifting and lowering mechanism for lifting and lowering the nozzle 36 are separate from each other. However, the ultrasonic wave generating unit 6 and the nozzle 36 may be lifted and lowered by a common mechanism mounted on the first movable arm 24, or the ultrasonic wave generating unit 6, the nozzle 36, and the wafer holding means 14 may be lifted and lowered by lifting and lowering the frame 22 of the Y-axis moving mechanism 20.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of producing a wafer from a hexagonal single-crystal ingot, comprising the steps of:
    forming a peel-off layer in the hexagonal single-crystal ingot by applying a laser beam having a wavelength transmittable through the hexagonal single-crystal ingot while positioning a focal point of the laser beam in the hexagonal single-crystal ingot at a depth corresponding to a thickness of a wafer to be produced from an end face of the hexagonal single-crystal ingot;
    generating ultrasonic waves from an ultrasonic wave generating unit positioned in facing relation to the wafer to be produced across a water layer interposed therebetween, thereby to break the peel-off layer; and
    positioning an image capturing unit sideways of the wafer to be produced and detecting when the wafer to be produced is peeled off the hexagonal single-crystal ingot
    wherein the image capturing unit is configured and arranged to capture an image of a gap between the wafer to be produced and an upper surface of a remaining portion of the hexagonal single-crystal ingot.

2. The method according to claim 1, wherein:
    the hexagonal single-crystal ingot includes a hexagonal single-crystal SiC ingot having a c-axis and a c-plane perpendicular to the c-axis; and
    the peel-off layer forming step of forming a peel-off layer includes the peel-off layer that is made up of modified regions where SiC is separated into Si and C in the ingot and a succession of cracks extending isotropically along the c-plane from the modified regions, by applying a laser beam having a wavelength transmittable through hexagonal single-crystal SiC to the hexagonal single-crystal SiC ingot while a focal point of the laser beam is being positioned in the hexagonal single-crystal SiC ingot at a depth corresponding to a thickness of the wafer from an end face of the hexagonal single-crystal SiC ingot.

3. The method according to claim 2, wherein:
    the hexagonal single-crystal ingot includes a hexagonal single-crystal SiC ingot having a c-axis inclined to a line normal to an end face thereof and a c-plane, the c-plane and the end face forming an off-angle therebetween; and
    the peel-off layer forming step of forming a peel-off layer includes the peel-off layer that is formed by continuously forming a modified region in the hexagonal single-crystal SiC ingot in a direction perpendicular to a direction in which the off-angle is formed, producing the succession of cracks extending isotropically along the c-plane from the modified region, indexing-feeding the hexagonal single-crystal SiC ingot and the focal point relatively to each other by a distance that is not larger than a width of the cracks in the direction in which the off-angle is formed, then continuously forming a modified region in the hexagonal single-crystal SiC ingot in the direction perpendicular to the direction in which the off-angle is formed, and producing the succession of cracks extending isotropically along the c-plane from the last-mentioned modified region.

4. The method according to claim 1, wherein the gap between the wafer to be produced and the upper surface of the remaining portion of the hexagonal single crystal ingot is detected by a peel-off detecting means that binarizes the image captured by the image capturing unit.

5. The method according to claim 4, wherein the peel-off detecting means determines whether the gap is greater than or equal to a predetermined value.

6. The method according to claim 5, wherein when it has been determined that the gap is greater than the predetermined value, the generating of the ultrasonic waves from the ultrasonic wave generating unit is stopped.

7. The method according to claim 4, wherein the peel-off detecting means determines whether the gap is less than or equal to a predetermined value.

8. The method according to claim 7, wherein when it has been determined that the gap is less than the predetermined value, the generating of the ultrasonic waves from the ultrasonic wave generating unit is continued.

9. The method according to claim 1, wherein a peel-off detecting means determines whether the gap is greater than or equal to a predetermined value.

10. The method according to claim 9, wherein when it has been determined that the gap is greater than the predetermined value, the generating of the ultrasonic waves from the ultrasonic wave generating unit is stopped.

11. The method according to claim 1, wherein a peel-off detecting means determines whether the gap is less than or equal to a predetermined value.

12. The method according to claim 11, wherein when it has been determined that the gap is less than the predetermined value, the generating of the ultrasonic waves from the ultrasonic wave generating unit is continued.

13. The method according to claim 1, wherein while the ultrasonic wave generating unit is generating the ultrasonic waves, the hexagonal single-crystal ingot is rotated, thereby allowing for the gap to be detected along an entire circumference of the hexagonal single-crystal ingot.

* * * * *